(12) United States Patent
Senoo

(10) Patent No.: US 9,048,085 B2
(45) Date of Patent: Jun. 2, 2015

(54) SEMICONDUCTOR DEVICE

(71) Applicant: Masaru Senoo, Okazaki (JP)

(72) Inventor: Masaru Senoo, Okazaki (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 13/773,423

(22) Filed: Feb. 21, 2013

(65) Prior Publication Data

US 2013/0214394 A1    Aug. 22, 2013

(30) Foreign Application Priority Data

Feb. 22, 2012   (JP) ................................. 2012-036416

(51) Int. Cl.
*H01L 29/66*      (2006.01)
*H01L 29/02*      (2006.01)
*H01L 29/40*      (2006.01)
(Continued)

(52) U.S. Cl.
CPC .............. *H01L 29/02* (2013.01); *H01L 29/408* (2013.01); *H01L 29/402* (2013.01); *H01L 29/404* (2013.01); *H01L 29/7395* (2013.01); *H01L 29/7811* (2013.01); *H01L 29/0619* (2013.01); *H01L 29/0638* (2013.01); *H01L 29/0657* (2013.01); *H01L 29/0696* (2013.01); *H01L 29/1095* (2013.01)

(58) Field of Classification Search
CPC .............. H01L 27/0629; H01L 29/872; H01L 29/0619; H01L 29/402; H01L 29/861; H01L 29/2003; H01L 29/78; H01L 29/06; H01L 29/0611; H01L 29/0692; H01L 29/407; H01L 29/0649; H01L 29/408; H01L 29/404; H01L 29/7811
USPC ......... 257/358, 359, 362, 363, 367, 379, 380, 257/483, 484, 487, 488, 489, 490, 495, 518, 257/554, 640, E23.164, E21.082, E21.197, 257/904, 649, 760, E21.293, 129, 168, 322, 257/339, 356, 409, 469, 583, 605, 606, 257/E29.008, E29.014, E29.023, E29.222; 438/454, 140, 201, 211, 257, 593, 438/FOR. 203
See application file for complete search history.

(56) References Cited

U.S. PATENT DOCUMENTS 6,492,689 B2 * 12/2002 Yamauchi et al. ............. 257/379
7,642,599 B2 * 1/2010 Ninomiya et al. ............ 257/355
(Continued)

FOREIGN PATENT DOCUMENTS

EP        0313249 A1    10/1988
JP        02-153529 A    6/1990
(Continued)

*Primary Examiner* — Fei Fei Yeung Lopez
(74) *Attorney, Agent, or Firm* — Kenyon & Kenyon LLP

(57) ABSTRACT

A field plate of a semiconductor device is provided with i) an insulating film that is formed on a surface of the semiconductor substrate, and includes a plurality of first regions, one for each of a plurality of FLR layers, that contact the layers and are arranged at intervals in a radial direction, and a plurality of second regions, one for each of the first regions, that are adjacent to the first regions in the radial direction, and ii) a plurality of first conductive films that are formed, one for each of the layers, inside of the insulating film, are arranged at intervals in the radial direction along the layers when a semiconductor substrate is viewed from above, and that are electrically connected to the layers. A thickness of at least a portion of the second regions is thicker than a thickness of the first regions.

2 Claims, 4 Drawing Sheets

(51) Int. Cl.
  *H01L 29/739*  (2006.01)
  *H01L 29/78*   (2006.01)
  *H01L 29/06*   (2006.01)
  *H01L 29/10*   (2006.01)

(56) References Cited

U.S. PATENT DOCUMENTS

| 2002/0130362 | A1* | 9/2002  | Park ............................ 257/341 |
| 2003/0218220 | A1* | 11/2003 | Takahashi et al. ............ 257/409 |
| 2006/0027880 | A1* | 2/2006  | Taya ............................ 257/392 |
| 2009/0045481 | A1  | 2/2009  | Nimural et al. |
| 2009/0294891 | A1* | 12/2009 | Niwa ........................... 257/488 |
| 2011/0006338 | A1* | 1/2011  | Senoo .......................... 257/139 |
| 2011/0079870 | A1* | 4/2011  | Senoo .......................... 257/504 |
| 2011/0291241 | A1  | 12/2011 | Yoshikawa et al. |

FOREIGN PATENT DOCUMENTS

| JP | 2008-181988 A | 8/2008 |
| JP | 2009-38356 A  | 2/2009 |
| JP | 2009-99863 A  | 5/2009 |
| JP | 2011-249580 A | 12/2011 |
| WO | 96/29744 A1   | 9/1996 |

* cited by examiner

SEMICONDUCTOR DEVICE

INCORPORATION BY REFERENCE

The disclosure of Japanese Patent Application No. 2012-036416 filed on Feb. 22, 2012 including the specification, drawings and abstract is incorporated herein by reference in its entirety.

BACKGROUND OF THE INVENTION

1. Field of the Invention

The invention relates to a semiconductor device.

2. Description of Related Art

In order to ensure voltage-resistance of a semiconductor device, a voltage-resistance retaining structure such as a field limiting ring layer (FLR layer) is formed in a peripheral region (a non-cell region) on a semiconductor substrate. Further, in order to ensure reliability of the semiconductor device, a field plate is formed on a front surface side of the FLR layer. Japanese Patent Application Publication No. 2009-38356 (JP 2009-38356 A) describes a semiconductor device in which a field plate that has a plurality of metal layers and a plurality of polysilicon layers is formed on a front surface side of each of a plurality of FLR layers. The plurality of FLR layers surround a cell region, and are arranged at intervals in a direction orthogonal to an extending direction of the FLR layers. The plurality of metal layers and the plurality of polysilicon layers are each formed corresponding to the plurality of FLR layers, and are arranged along the corresponding FLR layers. The polysilicon layers are formed inside of an insulating film formed on a front surface of the non-cell region of the semiconductor substrate. The metal layers are formed on a front surface of the insulating film, and a portion of each metal layer passes through the insulating film and reaches the FLR layer of the semiconductor substrate. Also, the metal layers and the polysilicon layers contact each other and are electrically connected together.

With the insulating film formed on the front surface of the non-cell region, an electric field tends to concentrate at a portion that contacts a region where the FLR layer is not formed. In particular, when the intervals between the plurality of polysilicon layers arranged in the insulating film are made smaller in order to improve shielding ability with respect to movable ions, the electric field tends to concentrate even more at the insulating film between adjacent polysilicon layers. As a result, the voltage-resistance of the semiconductor device may decrease.

SUMMARY OF THE INVENTION

One aspect of the invention relates to a semiconductor device that includes a semiconductor substrate that has a cell region in which a semiconductor element is formed, and a non-cell region that is provided around the cell region and that includes a first conductive substrate layer, and a plurality of second conductive FLR layers that are formed on a surface of the substrate layer, extend in a first direction along a periphery of the cell region and surround the cell region, and are arranged at intervals in a second direction orthogonal to the first direction; and a field plate that is formed on a surface of the non-cell region, and that is provided with i) an insulating film that is formed on a surface of the semiconductor substrate, and includes a plurality of first regions, one for each of the plurality of FLR layers, that contact the FLR layers and are arranged at intervals in the second direction, and a plurality of second regions, one for each of the first regions, that are adjacent to the first regions in the second direction, and ii) a plurality of first conductive films that are formed, one for each of the FLR layers, inside of the insulating film, are arranged at intervals in the second direction along the FLR layers when the semiconductor substrate is viewed from above, and that are electrically connected to the FLR layers, wherein a thickness of at least a portion of the second regions is thicker than a thickness of the first regions.

According to this aspect, a decrease in voltage-resistance of the semiconductor device is able to be inhibited. The semiconductor device described above is thus able to achieve both good reliability and good voltage-resistance.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
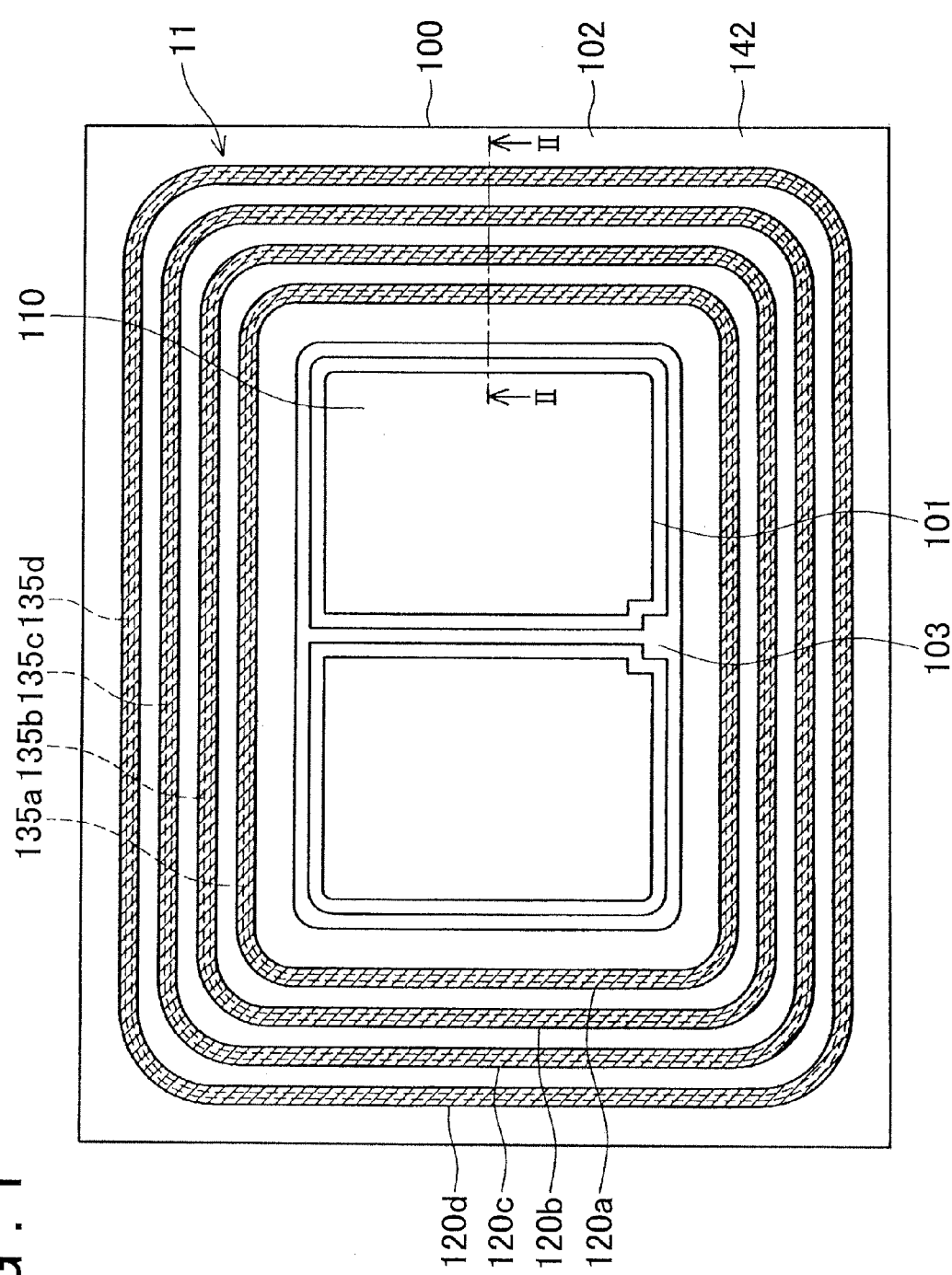
FIG. 1 is a plan view that conceptually illustrates a semiconductor device according to one example embodiment of the invention.

The semiconductor device of the invention is provided with a semiconductor substrate that has a cell region in which a semiconductor element is formed and a non-cell region provided around the cell region, and a field plate formed on a surface of the non-cell region. The semiconductor device may also be provided with a front surface electrode formed on a front surface of the cell region, and a back surface electrode formed on a back surface of the semiconductor substrate. The material of the front surface electrode is not limited, but a metal film the main component of which is aluminum (Al) or an aluminum-silicon alloy (AlSi) or the like may be used, for example. The material of the back surface electrode is not limited, but a stacked electrode in which Al or AlSi, titanium (Ti), nickel (Ni), and a nickel protective film of gold (Au) or the like, are stacked in order from the semiconductor substrate side, for example, may be used.

The non-cell region includes a first conductive-type substrate layer, and a plurality of second conductive-type FLR layers formed on a surface of the substrate layer. The plurality of FLR layers extend in a first direction along the periphery of the cell region so as to surround the cell region, and are arranged at intervals in a second direction that is orthogonal to a first direction. A region of the non-cell region, on which the FLR layers are formed, is a voltage-resistance retaining region. A second conductive-type impurity concentration of the FLR layers is preferably equal to or greater than $1 \times 10^{12}$ cm$^{-2}$, and more preferably, equal to or greater than $1 \times 10^{14}$ cm$^{-2}$.

The field plate includes an insulating film, and a plurality of first conductive films. The field plate is preferably formed on a surface of the voltage-resistance retaining region provided within the non-cell region.

The insulating film is formed on the surface of the semiconductor substrate, and includes a plurality of first regions and a plurality of second regions. The plurality of first regions are arranged, one for each FLR layer, at intervals in the second direction and contacting the FLR layers. The plurality of second regions are arranged, one for each first region, adjacent to the first regions in the second direction. A thickness of at least a portion of the second regions of the insulating film is thicker than the thickness of the first regions. In all of the second regions of the insulating film, the thickness of the insulating film may be thicker than it is in the first regions. Also, when there are a plurality of the second regions of the insulating film, there may be a second region in which the thickness of the insulating film is thicker than that of the first regions, and a second region in which the thickness of the insulating film is not thicker than that of the first regions (i.e., a region in which the thickness of the insulating film is thinner than or the same as that of the first regions). Also, a portion in which the thickness of the insulating film is thicker than that of the first regions, and a portion in which the thickness of the insulating film is not thicker than that of the first regions may be included in one second region that extends in the first direction along the periphery of the cell region and surrounds the cell region. In this case, the portion in which the thickness of the insulating film is thicker than that of the first regions is preferably provided in a corner portion when the semiconductor substrate is viewed from above. The FLR layers are curved in an arc-shape near a corner portion of the semiconductor substrate when the semiconductor substrate is viewed from above, and is linear near a linear portion of the semiconductor substrate. Similarly, the first regions and the second regions of the insulating film and the first conductive film formed along the FLR layers are also curved in arc-shapes near the corner portions of the semiconductor substrate when the semiconductor substrate is viewed from above, and linear near the linear portions of the semiconductor substrate.

The portion of the second region that is thicker than the first region of the insulating film may include a silicon oxide film formed by a LOCOS method (hereinafter this film will be referred to as "LOCOS oxide film"). Also, the first region of the insulating film may include a silicon nitride film that contacts the FLR layers. A silicon nitride film may also be formed somewhere other than the first region of the insulating film. For example, a silicon nitride film (such as SiN or $Si_3N_4$) may be formed on a portion of the second region, which is thinner than the first region or which has the same thickness as the first region.

When a thermal oxidation process is performed on the semiconductor substrate after forming the silicon nitride film on the surface of a portion of the semiconductor substrate, on which the LOCOS oxide film is not formed, a LOCOS oxide film that protrudes on the semiconductor substrate side is formed on the surface of the semiconductor substrate, on a portion where the silicon nitride film is not formed. When the thermal oxidation process is performed on the semiconductor substrate after forming the silicon nitride film on a portion of the surface of the semiconductor substrate, where the insulating film is not thick (i.e., in the first region of the insulating film or the like), a LOCOS oxide film that protrudes on the semiconductor substrate side is formed on a portion where the insulating film is thick (i.e., on at least a portion of the second regions of the insulating film). As a result, a portion of the insulating film can easily be made thicker. Also, silicon nitride has a higher density than silicon oxide does. Therefore, when silicon nitride is formed on the surface of the semiconductor substrate, the shielding ability with respect to movable ions improves, so the reliability of the semiconductor device improves.

The method by which at least a portion of the second regions of the insulating film is made thicker is not limited to a method using the LOCOS method described above. For example, after the semiconductor substrate of a portion where the insulating film is thicker is etched by etching or the like, an insulating film may be deposited on the surface of the semiconductor substrate by a CVD method or the like.

The first conducting films are formed, one for each FLR layer, inside of the insulating film, and are arranged at intervals in the second direction along the FLR layers when the semiconductor substrate is viewed from above. The FLR layers and the corresponding first conductive films are electrically connected together. The material of the first conductive films is not limited. That is, the first conductive films may be silicon films of polysilicon, amorphous silicon, or silicon nitride or the like, or the first conductive films may be metal films of aluminum or silver (Ag) or the like. When silicon films are used as the first conductive films, greater miniaturization is possible than is possible when using thick metal films. Also, when a semiconductor element having an insulated gate of an IGBT or the like is formed in a cell region, the first conductive films can be formed simultaneously with a process for forming the gate, if the material of the gate electrode (e.g., polysilicon) is used as the material of the first conductive films. The film thickness of the first conductive films is preferably no more than 1 μm. A thinner film thickness of the first conductive films enables the intervals between adjacent first conductive films to be narrower, and as a result, the shielding ability with respect to movable ions improves.

The first conductive films may be contacting the FLR layers via contact portions provided on the insulating film, or they may be contacting the FLR layers indirectly via other conductive material. For example, a field plate may include second conductive films for electrically connecting the first conductive films to the FLR layers. The second conductive films are arranged, one for each FLR layer, along the corresponding FLR layers, on the front side of the FLR layers, when the semiconductor substrate is viewed from above. Each of the second conductive films includes a surface portion formed on the surface of the insulating film, a first contact portion that extends from the surface portion and passes through the insulating film, and is electrically connected to the first conductive film, and a second contact portion that extends from the surface portion and passes through the insulating film, and is electrically connected to the FLR layer. The FLR layer is electrically connected to the first conductive film by the second conductive film. The material of the second conductive film is not limited. That is, the second conductive film may be a silicon film of polysilicon, amorphous silicon, or silicon nitride, or the second conductive film may be a metal film of aluminum or silver (Ag) or the like. When a film of material that is the same as material in the front surface electrode is used for the second conducting film (e.g., Al or AlSi), the second conductive film may be formed simultaneously with the process for forming the front surface electrode.

The semiconductor element formed in the cell region of the semiconductor device of the invention is not particularly limited. For example, the semiconductor element may be an IGBT, a MOSFET, or a diode or the like. These semiconductor elements may be of a vertical type or a horizontal type. Moreover, a protective film (such as a polyimide film or a silicon nitride film or the like) may be provided on the front surface of the field plate and the semiconductor substrate.

Figure 2:
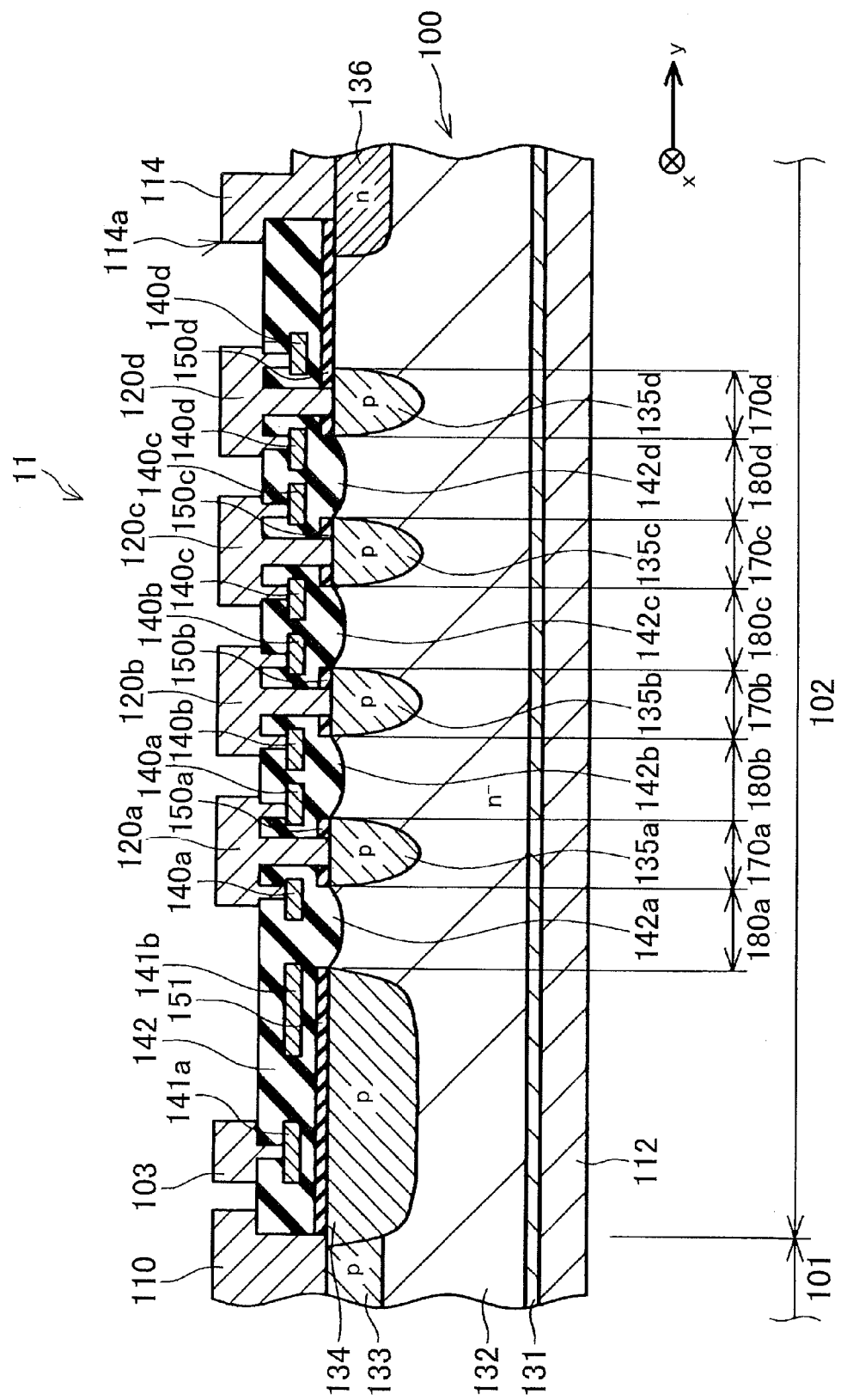
FIG. 2 is a sectional view taken along line II-II in FIG. 1.

As shown in FIGS. 1 and 2, the semiconductor device 10 includes a semiconductor substrate 100, a field plate 11, a front surface electrode 110, and a back surface electrode 112.

The semiconductor substrate 100 includes a cell region 101 and a non-cell region 102. The cell region 101 is positioned in the center of the semiconductor substrate 100 and is divided into two regions. The front surface electrode 110 is formed on the front surface of the cell region 101 of the semiconductor substrate 100. The back surface electrode 112 is formed on the back surface of the cell region 101 and the non-cell region 102 of the semiconductor substrate 100. The front surface electrode 110 is Al, and the back surface electrode 112 is an electrode in which Al, Ti, Ni, and Au are stacked in this order from the semiconductor substrate 100 side.

Although not shown in detail, an IGBT is formed in the cell region 101. The cell region 101 includes a p-type collector layer 131, an n-type substrate layer 132 that is a drift layer, a p-type body layer 133, and an n-type emitter layer (not shown). The substrate layer 132 is an n-type layer that includes phosphorous (P) as an impurity. The collector layer 131 and the substrate layer 132 extend to the non-cell region 102. A gate wiring 103 is formed surrounding the cell region 101, on the front surface side of the non-cell region 102 of the semiconductor substrate 100. The field plate 11 is formed farther toward the peripheral side (i.e., the positive direction of the y-axis shown in FIG. 2) of the semiconductor substrate 100 than the gate wiring 103.

The non-cell region 102 includes the substrate layer 132, a p-type p-layer 134 formed on the front surface of the substrate layer 132, p-type FLR layers 135a to 135d, an n-type n-layer 136, and a collector layer 131 formed on the back surface of the substrate layer 132. The FLR layers 135a to 135d are p-type semiconductor layers formed by ion-implanting boron (B) into the front surface of the substrate layer 132. The concentration of boron that is an impurity is equal to or greater than $1 \times 10^{14}$ cm$^{-2}$. The p-layer 134, the FLR layers 135a to 135d, and the n-layer 136 are arranged in this order from the side near the cell region 101, and are formed as a series of generally rectangular layers that extend in the direction along the periphery of the cell region 101 and surround the cell region. As shown in FIG. 1, when the semiconductor substrate 100 is viewed from above, the FLR layers 135a to 135d surround the periphery of the cell region 101, and have a series of generally rectangular shapes that are linear at linear portions of the semiconductor substrate 100 and are arc-shaped at corner portions of the semiconductor substrate 100. Although not shown in FIG. 1, the p-layer 134 and the n-layer 136 also surround the periphery of the cell region 101, and have linear at linear portions of the semiconductor substrate 100, and are arc-shaped at corner portions of the semiconductor substrate 100, similar to the FLR layers 135a to 135d. When a length direction of the FLR layers 135a to 135d (i.e., the circumferential direction of the generally rectangular FLR layers 135a to 135d shown in FIG. 1; the x-axis direction in FIG. 2) is designated as a first direction, and a direction orthogonal to the first direction (i.e., a direction of a normal vector of the series of generally rectangular FLR layers 135a to 135d shown in FIG. 1; the positive or negative direction of the y-axis shown in FIG. 2) is designated as a second direction, the p-layer 134, the FLR layers 135a to 135d, and the n-layer 136 are arranged at intervals in the second direction.

The field plate 11 includes a first insulating film 142 with silicon oxide as the material, second insulating films 150a to 150d and 151 with silicon nitride as the material, a plurality of first conductive films 140a to 140d with polysilicon as the material, and second conductive films 120a to 120d with aluminum as the material. The second insulating films 150a to 150d contact the front surfaces of the FLR layers 135a to 135d. The first insulating film 142 is formed on the front surface of the non-cell region 102 of the semiconductor substrate 100, and the second insulating films 150a to 150d and 151. The first conductive films 140a to 140d are formed inside of the first insulating film 142. The first conductive films 140a to 140d are arranged at intervals in the second direction, and are insulated from each other by the first insulating film 142 between them. The first conductive films 140a to 140d are arranged along the FLR layers 135a to 135d, respectively, and are formed in a series of generally rectangular shapes similar to the FLR layers 135a to 135d. The thickness of each of the first conductive films 140a to 140d is equal to or less than 1 μm. The first insulating film 142 is also formed on the front surface of the p-type layer 134. Conductive films 141a and 141b that use the same material as that of the first conductive films 140a to 140d are formed inside of the first insulating film 142. The conductive films 141a and 141b and the first conductive film 140a are arranged at intervals in the second direction, and are insulated from each other by the first insulating film 142 between them. The gate wiring 103 is positioned on the front surface side of the p-layer 134, and extends from the front surface of the first insulating film 142, through the first insulating film 142, to a position reaching the conductive film 141a. Also, an electrode 114 that is electrically connected to the n-layer 136 is formed farther on the peripheral side of the semiconductor substrate 100 than the field plate 11. The n-layer 136 and the electrode 114 are not shown in FIG. 1.

The second conductive films 120a to 120d contact the first conductive films 140a to 140d via first contact portions, respectively, and contact the FLR layers 135a to 135d via second contact portions, respectively. As shown in FIG. 2, the first contact portions of the second conductive films 120a to 120d extend from the front surface of the first insulating film 142 and pass through the first insulating film 142 to a position reaching the first conductive films 140a to 140d, where they are connected to the first conductive films 140a to 140d, respectively. Also, the second contact portions of the second conductive films 120a to 120d extend from the front surface of the first insulating film 142, pass through the first insulating film 142 and the second insulating films 150a to 150d, and are connected to the FLR layers 135a to 135d, respectively. The first conductive films 140a to 140d are electrically connected to the FLR layers 135a to 135d via the second conductive films 120a to 120d, respectively.

The first conductive films 140a to 140d and the conductive films 141a and 141b have polysilicon as the material, just like a gate electrode, not shown, of the insulated gate of the IGBT formed in the cell region 101, and include impurity ions of equal to or greater than $1 \times 10^{13}$ cm$^{-2}$. The first conductive films 140a to 140d are formed simultaneously with a process for forming the gate electrode of the IGBT, in the manufacturing process of the semiconductor device 10. The second conductive films 120a to 120d have aluminum as the material, just like the front surface electrode 110, and are formed simultaneously with a process for forming the front surface electrode 110, in the manufacturing process of the semiconductor device 10.

First regions 170a to 170d of the insulating film of the semiconductor device 10 are regions that include the second insulating films 150a to 150d that contact the plurality of FLR layers 135a to 135d, respectively, and the first insulating film 142 on the front surface side of these second insulating films 150a to 150d. The first regions 170a to 170d are arranged at intervals in the second direction. Also, second regions 180a to 180d are regions that are adjacent to the first regions 170a to 170d, respectively, in the second direction (in this case, in the positive direction of the y-axis shown in FIG. 2). More specifically, the second regions 180a to 180d are regions that include the first insulating film 142 that contacts the substrate layer 132 between the plurality of adjacent FLR layers 135a to 135d and the p-layer 134. As shown in FIG. 2, in the second regions 180a to 180d, the first insulating film 142 includes protruding portions 142a to 142d that protrude on the semiconductor substrate 100 side. The protruding portions 142a to 142d are a LOCOS oxide film. After forming a silicon nitride film on the front surface of the semiconductor substrate 100, the second insulating films 150a to 150d are able to be formed by removing the silicon nitride film on the portions that form the protruding portions 142a to 142d by photo-etching or the like. Moreover, when performing a thermal oxidation process on the semiconductor substrate 100, a LOCOS oxide film is formed on the front surface of the semiconductor substrate 100, on a portion where the second insulating films 150a to 150d are not formed, which enables the protruding portions 142a to 142d of the first insulating film 142 to be formed. Further, the entire first insulating film 142 is formed by depositing silicon oxide on the front surface of the semiconductor substrate 100 by CVD or the like. The first insulating film 142 provided between adjacent first conductive films 140a to 140d is inside the second regions 180a to 180d.

As described above, with the semiconductor device 10, in the second regions 180a to 180d, the first insulating film 142 protrudes with respect to the semiconductor substrate 100, so the insulating film of the second regions 180a to 180d is thicker than the insulating film of the first regions 170a to 170d. The insulating film is thicker in the second regions 180a to 180d where an electric field tends to concentrate, which mitigates the concentration of the electric field, so the voltage-resistance of the semiconductor device 10 is able to be improved. If the intervals between the first conductive films 140a to 140d were made narrow in order to improve the shielding ability with respect to movable ions, the electric field would tend to concentrate even more at the second regions 180a to 180d of the insulating film, but with the semiconductor device 10, the insulating film of the second regions 180a to 180d is thick, so concentration of the electric field is mitigated. According to the semiconductor device 10, both the shielding ability with respect to movable ions, and voltage-resistance are able to be achieved, so good reliability and good voltage-resistance are both able to be achieved. Furthermore, with the semiconductor device 10, the second insulating films 150a to 150d that have a silicon nitride film as the material are formed on the front surfaces of the FLR layers 135a to 135d, so the shielding ability with respect to movable ions is further improved. The second insulating films 150a to 150d are used as mask material when forming the protruding portions 142a to 142d of the second regions 180a to 180d by the LOCOS method, so the semiconductor device 10 is able to be manufactured by a simple manufacturing process. Also, polysilicon that has good microfabrication ability is used as the material of the first conductive films 140a to 140d, so the intervals between the first conductive films 140a to 140d are able to be narrower than they are when thick metal film or the like is used as the material. Moreover, the second conductive films 120a to 120d are provided, so the shielding ability with respect to movable ions is able to be further improved. The first conductive films 140a to 140d are formed simultaneously with the process for forming the gate electrode of the IGBT of the cell region 101, and the second conductive films 120a to 120d are formed simultaneously with the process for forming the front surface electrode 110. As a result, the semiconductor device 10 is able to be manufactured by a simple manufacturing process.

Figure 3:
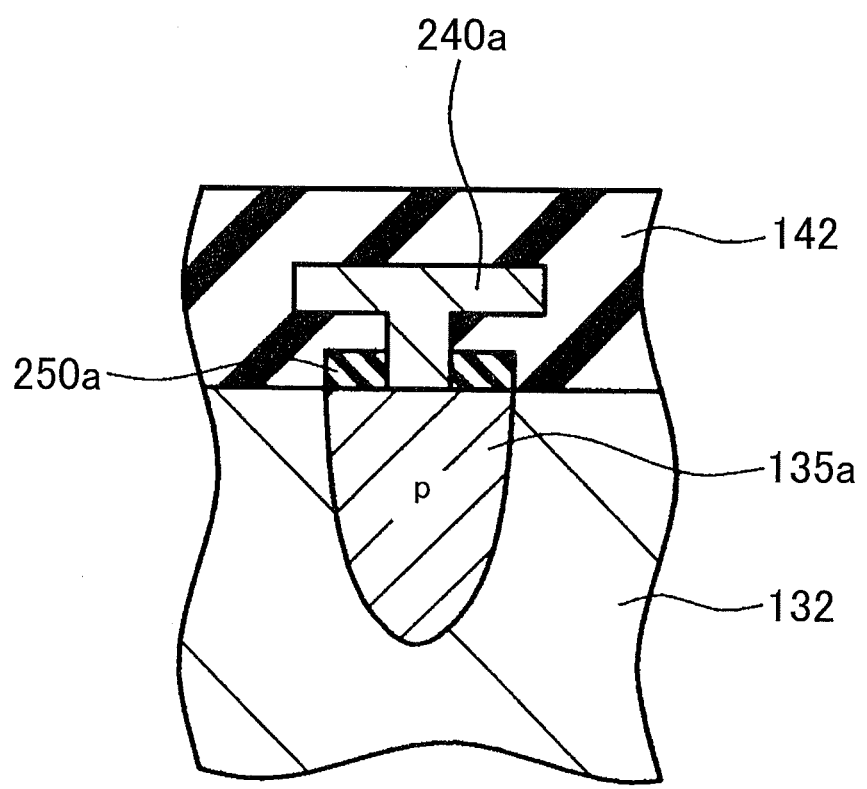
FIG. 3 is a sectional view of a portion of a field plate of a semiconductor device according to a modified example of the example embodiment of the invention.

In the example embodiment described above, the field plate 11 is provided with the second conductive films 120a to 120d, but the invention is not limited to this. For example, as shown in FIG. 3, second conductive films may not be provided, and a first conductive film 240a may pass through a first insulating film 142 and a second insulating film 250a in the direction of the semiconductor substrate 100, and reach an FLR layer 135a.

Figure 4:
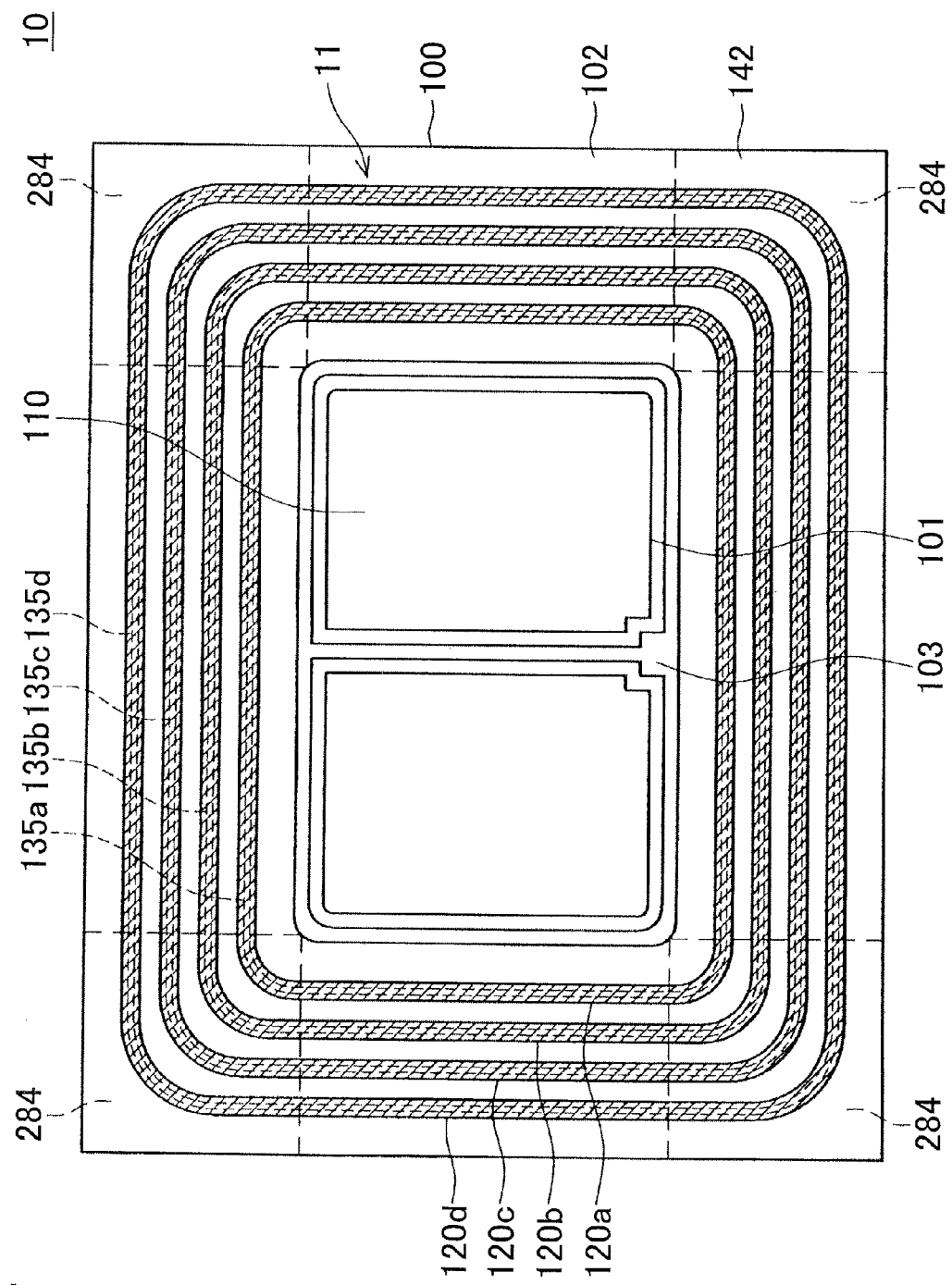
FIG. 4 is a plan view of a semiconductor device according to another modified example of the example embodiment of the invention.

Also, in the example embodiment described above, the thickness of the insulating film is thicker in all of the second regions of the insulating film than it is the first regions, but the invention is not limited to this. For example, instead of the example embodiment described above, the thickness of the insulating film in the second regions 180a and 180c of the insulating film of the semiconductor device 10 may be thicker than that of the first regions 170a to 170d, and the thickness of the insulating film in the second regions 180b and 180d may be the same as that of the first regions 170a to 170d. Also, the series of second regions along a single FLR layer may include a region in which the thickness of the insulating film is thicker than that of the first region, and a region in which the thickness of the insulating film is not thicker than that of the first region. In this case, as shown in FIG. 4, in a corner portion 284 when the semiconductor substrate 100 is viewed from above, the thickness of the insulating film of the second region is preferably thicker than that of the first region. In the descriptions of FIGS. 3 and 4, descriptions of modes that are the same as those of the semiconductor device 10 in the example embodiment described above are omitted.

While the invention has been described with reference to specific embodiments thereof, these example embodiments are for illustrative purposes only and are not intended to limit the scope of the claims for patent. Various modifications and variations of the specific examples described above are also included in the technology described in the scope of the claims for patent.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A semiconductor device comprising:
   a semiconductor substrate that has a cell region in which a semiconductor element is formed, and a non-cell region that is provided around the cell region and that includes a first conductive substrate layer, and a plurality of second conductive field limiting ring (FLR) layers that are formed on a surface of the substrate layer, extend in a first direction along a periphery of the cell region and surround the cell region, and are arranged at intervals in a second direction orthogonal to the first direction; and
   a field plate that is formed on a surface of the non-cell region, and that further comprises:
      an insulating film that includes protruding portions that protrude on a surface of the semiconductor substrate, and includes
         a plurality of first regions, one for each of the plurality of FLR layers, that contact the FLR layers and are arranged at intervals in the second direction, and
         a plurality of second regions, one for each of the first regions, that are adjacent to the first regions in the second direction,
      a plurality of first conductive films that are formed, one for each of the plurality of FLR layers, inside of the insulating film, are arranged at intervals in the second direction along the FLR layers when the semiconductor substrate is viewed from above, and that are electrically connected to the FLR layers, and
a plurality of second insulating films,
wherein a thickness of at least a portion of the second regions is thicker than a thickness of the first regions,
wherein the plurality of second insulating films contact the front surface of the plurality of FLR layers, and
wherein either the plurality of second insulating films or the plurality of first regions include a silicon nitride film that contacts the plurality of FLR layers.

2. The semiconductor device according to claim 1, wherein the portion of the second regions, which is thicker than the first regions of the insulating film includes a silicon oxide film formed by a LOCOS method.

* * * * *